US006221165B1

(12) United States Patent
Zhang et al.

(10) Patent No.: US 6,221,165 B1
(45) Date of Patent: Apr. 24, 2001

(54) HIGH TEMPERATURE PLASMA-ASSISTED DIFFUSION

(75) Inventors: Yanwei Zhang; Changfeng Xia, both of Plano, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/346,249

(22) Filed: Jul. 1, 1999

Related U.S. Application Data
(60) Provisional application No. 60/092,410, filed on Jul. 10, 1998.

(51) Int. Cl.$^7$ .............................. H01L 29/06; C23C 16/00
(52) U.S. Cl. ......................... 118/723; 257/618; 29/25.01
(58) Field of Search ............... 136/723 R; 294/641–643; 414/935, 939; 29/743; 257/618; 438/382, 679, 680, 900, 795; 204/192; 118/723.1, 723 R, 717, 716, 723 ER; 117/84

(56) References Cited

U.S. PATENT DOCUMENTS

| Re. 31,473 | 12/1983 | Kilby et al. ............................. 425/6 |
| 4,425,408 | * 1/1984 | Levine et al. ....................... 428/403 |
| 4,439,463 | * 3/1984 | Miler ...................................... 427/39 |
| 4,794,019 | * 12/1988 | Miler .................................... 427/124 |
| 5,043,299 | * 8/1991 | Chang et al. ........................ 437/192 |
| 5,462,639 | 10/1995 | Matthews et al. ................ 156/662.1 |
| 5,955,776 | * 9/1999 | Ishikawa .............................. 257/618 |
| 6,041,735 | 3/2000 | Murzin et al. ....................... 118/723 |
| 6,055,928 | 5/2000 | Murzin et al. ....................... 118/723 |

FOREIGN PATENT DOCUMENTS
2-119241   10/1988   (JP) .

OTHER PUBLICATIONS
U.S. Ser. No. 60/032,340, filed on Dec. 4, 1996, entitled *Spherical Surface Semiconductor Integrated Circuit*, Akira Ishikawa, Abstract and 14 sheets of drawings.

U.S. Ser. No. 09/033,180, filed on Mar. 2, 1998, entitled *Inductively Coupled Plasma Powder Vaporization for Fabricating Integrated Circuits*, Ivan Herman Murzin, Abstract and 2 sheets of drawings.

U.S. Ser. No. 09/032,965, filed on Mar. 2, 1998, entitled *Plasma Immersion Ion Processor for Fabricating Semiconductor Integrated Circuits*, Ivan Herman Murzin, Abstract and 2 sheets of drawings.

U.S. Ser. No. 09/069,645, filed on Apr. 29, 1998, entitled *Plasma–Assisted Metallic Film Deposition*, Changfeng Xia, Abstract and 2 sheets of drawings.

* cited by examiner

*Primary Examiner*—Olik Chaudhuri
*Assistant Examiner*—Shrinivas H. Rao
(74) *Attorney, Agent, or Firm*—Haynes and Boone LLP

(57) ABSTRACT

An apparatus and method for performing thermal diffusion on the substrate of a device such as a spherical shaped semiconductor. To this end, one embodiment provides an enclosure containing a plurality of apertures and a plasma chamber. A plasma generator for producing a plasma torch is incorporated with the plasma chamber, the plasma generator including a conductor coil electrically connected to a radio frequency energy generator. A first conduit registering with a first opening in the enclosure allows the semiconductor devices to be received into the plasma chamber. A second conduit registering with a second opening in the enclosure allows the semiconductor devices to exit the plasma chamber. Processing fluids are injected into the plasma chamber so that a doping material from the process fluid is ionized at an upper portion of the plasma torch to form a high density diffusion plasma. This high density diffusion plasma supports a quick and uniform diffusion of the doping material into the substrate of the semiconductor devices.

21 Claims, 1 Drawing Sheet

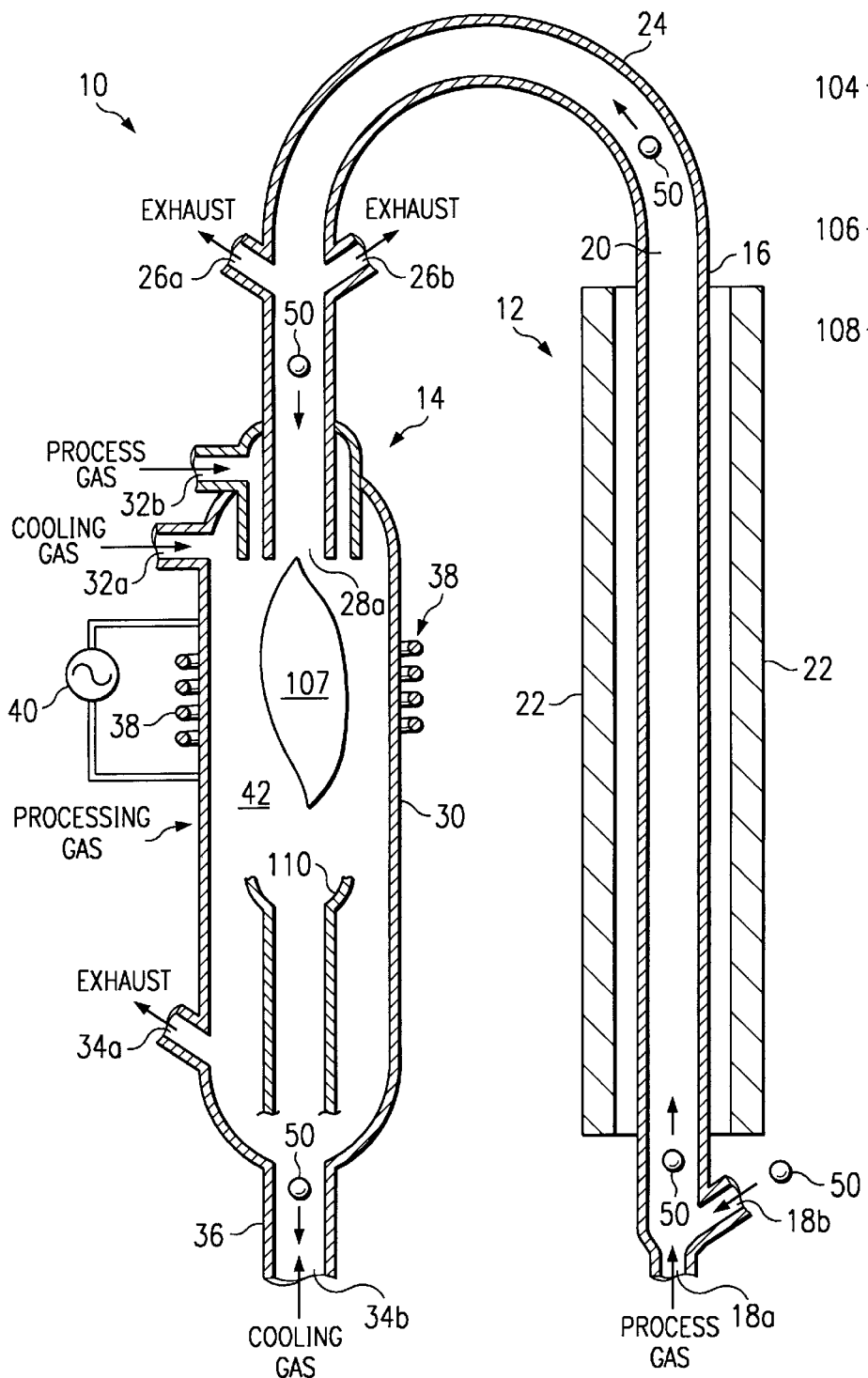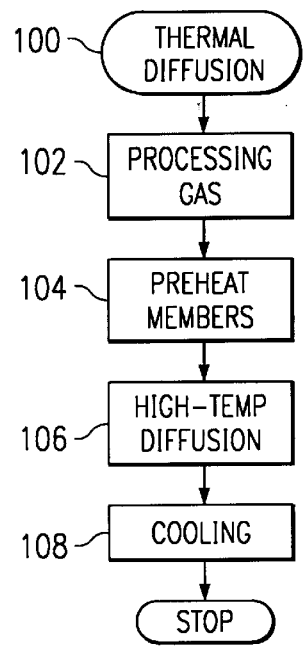
Fig. 1
Fig. 2

HIGH TEMPERATURE PLASMA-ASSISTED DIFFUSION

CROSS REFERENCE

This application claims the benefit of U.S. Provisional Patent Application Ser. No. 60/092,410 filed Jul. 10, 1998, which is herein incorporated by reference.

BACKGROUND OF THE INVENTION

The invention relates generally to semiconductor integrated circuits, and more particularly, to an apparatus and method for fabricating a spherical-shaped semiconductor device.

Conventional semiconductor devices, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat. One processing step that is performed in the fabrication facility is thermal diffusion. Traditional thermal diffusion is based on three process steps. First of all, a doping oxide is deposited on the wafer. Next, thermal diffusion is performed on the wafer substrate, typically at a temperature between 900° C. to 1200° C. to prevent warpage and detrimental stress to the wafer. After thermal diffusion, the doping oxide is removed. The depth of diffusion depends on several factors, including the crystal orientation of the substrate. On a flat wafer, the crystal orientation is relatively consistent.

In co-pending U.S. Pat. No. 5,955,776, filed on May 16, 1997, assigned to the same assignee as the present application and hereby incorporated by reference, a method and apparatus for manufacturing spherical-shaped semiconductor integrated circuit devices is disclosed. Being spherical-shaped, the crystal orientation of the devices differs for each portion of the device. The present invention is specific to an apparatus and method for performing a consistent, high-temperature diffusion on devices such as those that are spherical in shape.

SUMMARY OF THE INVENTION

The present invention, accordingly, provides an apparatus and method for performing thermal diffusion on the substrate of a device such as a spherical shaped semiconductor. To this end, one embodiment provides an enclosure containing a plurality of apertures and a plasma chamber. A plasma generator for producing a plasma torch is incorporated with the plasma chamber, the plasma generator including a conductor coil electrically connected to a radio frequency (RF) energy generator. A first conduit registering with a first opening in the enclosure allows the semiconductor devices to be received into the plasma chamber. A second conduit registering with a second opening in the enclosure allows the semiconductor devices to exit the plasma chamber. Processing fluids are injected into the plasma chamber so that a doping material from the process fluid is ionized at an upper portion of the plasma torch to form a high density diffusion plasma. This high density diffusion plasma supports a quick and uniform diffusion of the doping material into the substrate of the semiconductor devices.

In another embodiment, the semiconductor devices and/or the processing fluids are preheated in a preheat section. By preheating the semiconductor devices, the surfaces of the devices are better suited to accept the doping material. By preheating the processing fluids, the doping material contained in the fluid is quicker to ionize by the plasma torch.

BRIEF DESCRIPTION OF THE DRAWINGS

FIG. 1 illustrates a diffusion processor according to one embodiment of the invention.

FIG. 2 is a flow chart of a method using the processor of FIG. 1.

DESCRIPTION OF THE PREFERRED EMBODIMENT

Referring to the FIG. 1, the reference numeral 10 designates, in general, one embodiment of a processor for performing thermal diffusion on a spherical shaped semiconductor device. It is understood that the processor 10 is merely an example of various similar processors of different shape and arrangement.

The processor 10 can be separated into two sections: a preheat section 12 and a plasma section 14. The preheat section 12 includes a vertically extending hollow tube 16 having two inlets 18a, 18b and an outlet 20 diametrically opposed to the inlets. Surrounding at least a portion of the hollow tube 16 is a preheater furnace 22. The furnace 22 is of sufficient size and length so that an object moving through the tube 16 can be heated to a temperature of about 600° C.

A radially extending conduit 24 connects the tube 16 to the plasma section 14. One or more exhaust outlets 26a, 26b are also placed in the conduit 24. One end of the conduit 24 registers with an inlet 28a of an enclosure 30, which is in the shape of a large tube, having a diameter that is greater than the diameter of the conduit 24. The enclosure 30 includes additional inlets 32a, 32b and a plurality of outlets 34a, 34b. A horizontally extending exit conduit 36 registers with the outlet 34b and is coaxial with and diametrically opposed to where the conduit 24 registers with the enclosure 30. Surrounding a portion of the enclosure 30 is an electric coil 38 connected to a radio frequency generator type power source 40. The coil 38, which is coaxial with the conduits 24, 36, define a plasma chamber 42 inside the enclosure 30. U.S. Pat. No. 6,041,735, filed Mar. 2, 1998 and which is herein incorporated by reference, describes a similar plasma chamber that may be used.

In operation, a plurality of members 50, each of a semiconductor material, are introduced into the processor 10. The members 50 are preferably of a generally spherical shape and could be of the same type formed according to the technique disclosed in the above-identified and presently incorporated U.S. Pat. No. 5,955,776. A process gas from conduit inlet 18a is included with the members 50 and serves to float the members throughout the processor 10.

Referring to FIG. 2, a method 100 can be used to perform thermal diffusion on the member 50 as they move through the processor 10. At step 102, a processing fluid is inserted in inlet 18a to meet with a flow of members 50 from the inlet 18b. The processing fluid can be one of many different materials, including liquids $POCL_3$, $BBr_3$ or gases $PF_3$, $BF_3$, $PH_3$, $B_2H_3$, depending on external processing requirements. At step 104, the members 50, along with the processing fluid from the inlet 18a, enter the preheat section 12 and are preheated to about 600° C. by the furnace 22.

At step 106, the members 50 and processing fluid pass through the conduit 24 and enter the plasma section 14.

Additional process liquids are injected into the chamber 42 through the inlet 32b. An inductively coupled plasma torch 107 is formed inside the plasma chamber 42 by the coil 38 and the process liquid. The torch 107 is at a very high temperature, for example 4000° C. to 5000° C. with the power source 40 operating at between 500W to 2000W. The chamber 42 has a pressure of about one atmosphere.

The members 50 fall through the torch 107 so that they reach a temperature of about 1380° C. to 1400° C. Phosphorous or Boron (as applicable) from the process fluid is ionized at the upper portion of the torch 107, as seen from FIG. 1, and form a high density diffusion plasma. Radicals and ions from the high density diffusion plasma are absorbed into the surface of the members 50 and react with the semiconductor substrate. A doping oxide layer is quickly formed and the boron or phosphorous ions and radicals instantly diffuse into the substrate of the members 50. Because the ions and radicals have very active chemical features at such a high temperature, diffusion occurs very fast.

At step 108, the members 50 are cooled with an inert cooling gas, such as Ar, injected through the conduit 36. Additionally, a second cooling gas can be injected into the chamber 30 through the inlet 32b. The second cooling gas also serves to cool the walls of the enclosure 30 while the torch 107 is active.

Several advantages result from the present invention. For one, plasma ion oxidation is not very responsive to crystal orientation, which is important for many different devices. Therefore, a uniform diffusion depth can be achieved across the entire device. Also, the diffusion occurs very fast due to the relatively high temperatures. The spherical shape of the members 50 reduces the effect of warpage and stress that conventional wafers experience, and therefore support such high-temperature operations.

It is understood that several variations may be made in the foregoing. For example, additional inlets and outlets may be included to facilitate specific design needs. Further, the shape and orientation of the components is merely exemplary, it being understood that different setups can be used to achieve the same results. Further still, a catcher 110 (FIG. 1) may be included in the enclosure 30 to receive the members 50 and facilitate the cooling process. Other modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus for performing thermal diffusion on a spherical shaped semiconductor device, the apparatus comprising:

a pre-condition chamber for receiving and preheating said semiconductor device;

means connected to the pre-condition chamber for receiving a processing gas; and a plasma diffusion chamber for diffusing the semiconductor device at a high temperature, the plasma chamber including an inlet for receiving the semiconductor device and the processing gas, an outlet diametrically opposed to the inlet for discharging the device, and means for providing a plasma torch inside the chamber, the plasma torch being positioned between the inlet and outlet of the plasma diffusion chamber so that a first portion of the torch is nearer the inlet to ionize the processing gas at a temperature between 4000° C. and 5000° C., and a second portion of the torch extends towards the outlet to melt the spherical shaped semiconductor device at a temperature above 1380° C.;

wherein the preheated semiconductor device is able to move directly from the inlet to the outlet, and wherein the processing gas is ionized immediately prior to said semiconductor device being melted so that the ionized processing gas can subsequently diffuse into the melted semiconductor device.

2. The apparatus of claim 1 wherein said inlet and outlet are positioned to allow the semiconductor device to free fall through the plasma diffusion chamber.

3. The apparatus of claim 1 wherein said semiconductor device moves through the pre-condition chamber at a rate controlled by gravity and by the processing gas.

4. The apparatus of claim 1 further includes a connection chamber radially extending from the pre-condition chamber to the plasma diffusion chamber for smoothly transporting said semiconductor device to the plasm diffusion chamber after being pre-conditioned in the pre-condition chamber.

5. The apparatus of claim 4 wherein the connection chamber further comprises a plurality of exhaust outlets for releasing exhaust fumes.

6. The apparatus of claim 1 wherein the pre-condition chamber further includes:

a preheat section for heating said semiconductor device while said semiconductor device is carried therethrough by the processing gas.

7. The apparatus of claim 6 wherein the preheat section is coaxially surrounded by heat furnaces.

8. The apparatus of claim 1 wherein the processing gas is one of either POCL3, BBr3, PF3, BF3, PH3, or B2H3.

9. The apparatus of claim 1 further comprising a second inlet for feeding cooling gas to protect the inside surface of the plasma diffusion chamber while the plasma torch is active.

10. The apparatus of claim 1 wherein the plasma diffusion section further comprises at least one exhaust outlet for releasing exhaust fumes.

11. An apparatus for performing thermal diffusion on a semiconductor device, the apparatus comprising:

an enclosure containing an input aperture and an output aperture;

a chamber defined within the enclosure and centered along an axis between the input and output apertures, the chamber for receiving a processing fluid and said semiconductor device from the input aperture; and means for forming a plasma torch inside the chamber and along the axis, so that a first portion of the plasma torch is positioned near the input aperture for ionizing the processing fluid at a temperature between 4000° C. and 5000° C., and a second portion of the plasma torch is positioned between the first portion and the output aperture for melting at least a portion of the semiconductor device to a temperature between 4000° C. and 5000° C.;

wherein said semiconductor device is allowed to move through the input aperture, into the chamber, and then through the output aperture, and wherein the first portion of the plasma torch activates radicals and ions in the processing fluid to facilitate said thermal diffusion of the radicals and ions into the subsequently melted portion of said semiconductor device.

12. The apparatus of claim 11 further comprising:
a plurality of chemical inlets registering with the chamber for supplying the processing fluid.

13. The apparatus of claim 11 further comprising:
a preheat section registering upstream of the chamber for heating the semiconductor device to a first temperature.

14. The apparatus of claim 11 wherein the rate at which the semiconductor device moves through the chamber is controlled by gravity and by the process fluid.

15. The apparatus of claim 13 further comprising:
a materials inlet registering with the preheat section for providing a gas to control the movement of the semiconductor device through the preheat section and the chamber and for supplying an additional processing fluid.

16. The apparatus of claim 11 further comprising a plurality of exhaust outlets registering with the enclosure for discharging exhaust fumes.

17. The apparatus of claim 11 wherein the means for forming the plasma torch includes a conductor coil and utilizes a radio frequency energy supplied by the conductor coil.

18. The apparatus of claim 13 wherein the preheat section includes a resistance-type furnace.

19. The apparatus of claim 11 wherein the processing fluid is one of either $POCL_3$, $BBr_3$, $PF_3$, $BF_3$, $PH_3$, or $B_2H_3$.

20. The apparatus of claim 11 wherein the semiconductor device is substantially spherical in shape.

21. The apparatus of claim 11 wherein the chamber is a pressured chamber.

* * * * *